(12) United States Patent
Petty-Weeks et al.

(10) Patent No.: US 10,937,759 B2
(45) Date of Patent: *Mar. 2, 2021

(54) RADIO FREQUENCY TRANSMISSION LINE

(71) Applicant: SKYWORKS SOLUTIONS, INC., Woburn, MA (US)

(72) Inventors: Sandra Louise Petty-Weeks, Newport Beach, CA (US); Guohao Zhang, Nanjing (CN); Hardik Bhupendra Modi, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 91 days.

This patent is subject to a terminal disclaimer.

(21) Appl. No.: 15/593,160

(22) Filed: May 11, 2017

(65) Prior Publication Data

US 2017/0271301 A1    Sep. 21, 2017

Related U.S. Application Data

(62) Division of application No. 13/464,775, filed on May 4, 2012, now Pat. No. 9,679,869.

(Continued)

(51) Int. Cl.
*H01Q 1/00* (2006.01)
*H01L 23/00* (2006.01)
(Continued)

(52) U.S. Cl.
CPC .............. *H01L 24/85* (2013.01); *H01L 23/66* (2013.01); *H01L 24/45* (2013.01); *H01L 24/48* (2013.01);
(Continued)

(58) Field of Classification Search
None
See application file for complete search history.

(56) References Cited

U.S. PATENT DOCUMENTS

| 5,521,406 A | 5/1996 | Tserng et al. |
| 6,028,011 A | 2/2000 | Takase et al. |

(Continued)

FOREIGN PATENT DOCUMENTS

| CN | 1953175 | 4/2007 |
| CN | 101595636 | 12/2009 |

(Continued)

OTHER PUBLICATIONS

Chang, ChinAn, "Interactions between Au and Cu across a Ni barrier layer", J. Appl. Phys. vol. 60, No. 3, Aug. 1, 1986, pp. 1220-1222.

(Continued)

*Primary Examiner* — Trinh V Dinh
(74) *Attorney, Agent, or Firm* — Knobbe, Martens, Olson & Bear, LLP (57) ABSTRACT

This disclosure relates to a radio frequency (RF) transmission line for high performance RF applications. The RF transmission line includes a bonding layer having a bonding surface and configured to receive an RF signal, a barrier layer proximate the bonding layer, a diffusion barrier layer proximate the bonding layer and configured to prevent contaminant from entering the bonding layer, and a conductive layer proximate the diffusion barrier layer. The diffusion barrier layer has a thickness that allows the received RF signal to penetrate the diffusion barrier layer to the conductive layer. The diffusion barrier layer can be a nickel layer.

20 Claims, 5 Drawing Sheets

Related U.S. Application Data (60) Provisional application No. 61/530,915, filed on Sep. 2, 2011, provisional application No. 61/531,553, filed on Sep. 6, 2011, provisional application No. 61/561,742, filed on Nov. 18, 2011.

(51) Int. Cl.
*H01L 23/66* (2006.01)
*H05K 1/02* (2006.01)
*H05K 3/24* (2006.01)

(52) U.S. Cl.
CPC ....... *H01L 24/73* (2013.01); *H01L 2223/6611* (2013.01); *H01L 2223/6655* (2013.01); *H01L 2223/6677* (2013.01); *H01L 2224/32225* (2013.01); *H01L 2224/45015* (2013.01); *H01L 2224/45139* (2013.01); *H01L 2224/45144* (2013.01); *H01L 2224/45147* (2013.01); *H01L 2224/48091* (2013.01); *H01L 2224/48159* (2013.01); *H01L 2224/48227* (2013.01); *H01L 2224/48465* (2013.01); *H01L 2224/48644* (2013.01); *H01L 2224/48844* (2013.01); *H01L 2224/73265* (2013.01); *H01L 2224/85444* (2013.01); *H01L 2924/00011* (2013.01); *H01L 2924/00012* (2013.01); *H01L 2924/01015* (2013.01); *H01L 2924/01047* (2013.01); *H01L 2924/10329* (2013.01); *H01L 2924/12042* (2013.01); *H01L 2924/1305* (2013.01); *H01L 2924/13051* (2013.01); *H01L 2924/1421* (2013.01); *H01L 2924/1423* (2013.01); *H01L 2924/19041* (2013.01); *H01L 2924/19042* (2013.01); *H01L 2924/19105* (2013.01); *H01L 2924/3011* (2013.01); *H05K 1/0243* (2013.01); *H05K 3/244* (2013.01); *H05K 2201/0341* (2013.01)

(56) References Cited

U.S. PATENT DOCUMENTS

| | | |
|---|---|---|
| 6,201,454 B1 | 3/2001 | Kinayman et al. |
| 6,362,089 B1 | 3/2002 | Molla et al. |
| 6,399,475 B1 | 6/2002 | Petit |
| 6,448,648 B1 | 9/2002 | Boos |
| 6,798,050 B1 | 9/2004 | Homma et al. |
| 6,974,776 B2 | 12/2005 | Dean et al. |
| 8,021,918 B2 | 9/2011 | Lin et al. |
| 8,324,721 B2 | 12/2012 | Udompanyavit et al. |
| 8,456,856 B2 | 6/2013 | Lin et al. |
| 8,686,537 B2 * | 4/2014 | Sun .............. H01L 23/642 257/529 |
| 8,889,995 B2 * | 11/2014 | Sun .............. H01L 23/66 174/261 |
| 8,896,091 B2 * | 11/2014 | Sun .............. H01L 23/642 257/529 |
| 8,983,406 B2 | 3/2015 | Zhang et al. |
| 9,041,472 B2 * | 5/2015 | Chen .............. H01L 23/49838 330/307 |
| 9,679,869 B2 * | 6/2017 | Petty-Weeks .......... H01L 23/66 |
| 10,529,686 B2 | 1/2020 | Petty-Weeks et al. |
| 2002/0096765 A1 | 7/2002 | Ling et al. |
| 2005/0003677 A1 | 1/2005 | Dean et al. |
| 2005/0104207 A1 | 5/2005 | Dean et al. |
| 2006/0138650 A1 | 6/2006 | Hidalgo et al. |
| 2006/0153495 A1 | 7/2006 | Wynne et al. |
| 2007/0069347 A1 | 3/2007 | Lin et al. |
| 2007/0093229 A1 | 4/2007 | Yamakawa et al. |
| 2008/0079461 A1 | 4/2008 | Lin et al. |
| 2008/0080112 A1 | 4/2008 | Lin et al. |
| 2008/0142935 A1 * | 6/2008 | Montoriol ......... H01L 23/49531 257/666 |
| 2008/0264681 A1 | 10/2008 | Iwai et al. |
| 2009/0011922 A1 | 1/2009 | De Rochemont |
| 2009/0085229 A1 | 4/2009 | Wu et al. |
| 2009/0195334 A1 | 8/2009 | Goi |
| 2009/0243028 A1 * | 10/2009 | Dong ..................... H01L 23/66 257/499 |
| 2009/0257208 A1 * | 10/2009 | Filipovic ........... H01L 23/49844 361/760 |
| 2009/0294158 A1 | 12/2009 | Matsushima et al. |
| 2009/0315848 A1 | 12/2009 | Ku et al. |
| 2010/0089613 A1 | 4/2010 | Takayanagi et al. |
| 2010/0090767 A1 | 4/2010 | Ohnishi et al. |
| 2010/0178879 A1 | 7/2010 | Sato et al. |
| 2010/0230789 A1 | 9/2010 | Yorita et al. |
| 2011/0050357 A1 * | 3/2011 | Kim .................... H01L 23/5227 333/32 |
| 2012/0139006 A1 | 6/2012 | Zampardi et al. |
| 2012/0143060 A1 | 6/2012 | Weekamp et al. |
| 2012/0293520 A1 | 11/2012 | Yun et al. |
| 2014/0325150 A1 | 10/2014 | Hashimoto et al. |
| 2015/0039391 A1 | 2/2015 | Hershkovitz et al. |
| 2016/0145747 A1 | 5/2016 | Watson et al. |
| 2017/0271302 A1 | 9/2017 | Petty-Weeks et al. |
| 2017/0271303 A1 | 9/2017 | Petty-Weeks et al. |
| 2017/0301647 A1 | 10/2017 | Petty-Weeks et al. |

FOREIGN PATENT DOCUMENTS

| | | |
|---|---|---|
| JP | H07 46007 | 2/1995 |
| JP | H08-213474 | 8/1996 |
| JP | H09213730 | 8/1997 |
| JP | 2003051567 | 2/2003 |
| JP | 2007 012716 | 1/2007 |
| JP | 2007-031826 | 2/2007 |
| JP | 2009 228021 | 10/2009 |
| JP | 2010 171037 | 8/2010 |
| TW | 201034540 | 9/2010 |
| TW | M394582 | 12/2010 |
| WO | WO 2008 093626 | 8/2008 |
| WO | WO 2013 032545 | 3/2013 |

OTHER PUBLICATIONS

Chen, Xiaoming, "EM Modeling of Microstrip Conductor Losses Including Surface Roughness Effect", IEEE Microwave and Wireless Components Letters, vol. 17, No. 2, pp. 94-96, Feb. 2007.
Cullen et al., "Effects of Surface Finish on High Frequency Signal Loss Using Various Substrate Materials", Jun. 1, 2001. 10 Pages.
International Search Report and Written Opinion dated Nov. 20, 2012 for PCT Application No. PCT/US2012/036836 filed May 7, 2012. 13 Pages.
Mathews, et al., "RF System in Package: Considerations, Technologies and Solutions," Amkor Technology. 8 Pages. Jul. 2003.
Sandor et al., "The Effects of Lead-Free Solder Finishes on Microwave Printed Circuit Board Performance", Presented at the Antenna Systems and Short Range Wireless 2005 Conference, Santa Clara, CA, Sep. 22, 2005. 37 Pages.
Staiculescu et al., "Ni—Au Surface Finish Effects on RF Performance", 1999 IEEE MTT-S Digest, pp. 1909-1912.
Wu et al., "Surface Finish Effects on High-Speed Signal Degradation", IEEE Transactions on Advanced Packaging, vol. 31, No. 1, pp. 182-189, Feb. 2008.
Franco, Marc J., "Mobile Handset Power Amplifiers", IEEE Microwave Magazine, Dec. 2009 Supplement, pp. S16-S19.
C. F. Chu, et al., "Low-resistance ohmic contacts on p-type GaN using Ni/Pd/Au metallization," Applied Physics Letters, vol. 77, No. 21, pp. 3423-3425, Nov. 2000.

\* cited by examiner

RADIO FREQUENCY TRANSMISSION LINE

CROSS-REFERENCE TO RELATED APPLICATIONS

This application is a divisional of U.S. patent application Ser. No. 13/464,775, filed May 4, 2012, titled "TRANSMISSION LINE FOR HIGH PERFORMANCE RADIO FREQUENCY APPLICATIONS," which claims the benefit under 35 U.S.C. §119(e) of U.S. Provisional Patent Application No. 61/530,915, filed Sep. 2, 2011, titled "DIFFUSION BARRIER LAYER FOR USE IN A RADIO FREQUENCY TRANSMISSION LINE," U.S. Provisional Patent Application No. 61/531,553, filed Sep. 6, 2011, titled "DIFFUSION BARRIER LAYER FOR USE IN A RADIO FREQUENCY TRANSMISSION LINE," and U.S. Provisional Patent Application No. 61/561,742, filed Nov. 18, 2011, titled "FINISH PLATING FOR HIGH PERFORMANCE RADIO FREQUENCY APPLICATIONS." The disclosures of each of these applications are hereby incorporated by reference herein in their entireties.

BACKGROUND

Technical Field

The disclosed technology relates to transmission lines for high performance radio frequency applications.

Description of the Related Technology

Transmission lines can be implemented in a variety of contexts, such as on a packaging substrate or printed circuit board (PCB). Multi-layer laminate PCBs or package substrates are extensively used in radio frequency (RF) applications.

RF circuits, such as power amplifiers, low noise amplifiers (LNAs), mixers, voltage controlled oscillators (VCOs), filters, switches and whole transceivers have been implemented using semiconductor technologies. However, in RF modules (for example, an RF front-end module including power amplifiers, switches, and/or filters), single chip integration may not be practical due to different blocks being implemented in different semiconductor technologies. For instance, a power amplifier may be formed by a GaAs process, while related control and/or bias circuitry may be formed by a CMOS process.

Long transmission lines and/or other on-chip passives can consume large chip area. Consequently, multi-chip module (MCM) and/or system in package (SiP) assembly technology can be used to achieve low cost, small size and/or high performance in RF modules. Laminate technology can be used for MCM assembly, in which transmission lines are implemented on a laminate substrate. Conductor loss in such transmission lines can have a significant impact on the performance of any of the elements in the MCM. Accordingly, laminate plating technology can impact RF performance significantly.

The cost of laminate technology can be driven by the choice materials for performance and/or assembly needs. RF SiPs that use gold (Au) wire bonding to connect RF circuit elements to transmission lines can use a variety of different finish platings such as lower loss, more expensive NiAu (for example, due to thicker Au) or higher loss, less expensive NiPdAu. Accordingly, a need exists for cost effective, high performance technology for RF transmission lines.

SUMMARY OF CERTAIN INVENTIVE ASPECTS

The innovations described in the claims each have several aspects, no single one of which is solely responsible for its desirable attributes. Without limiting the scope of this invention, some prominent features will now be briefly discussed.

One aspect of the disclosure is a radio frequency (RF) transmission line configured for use in a radio frequency (RF) circuit. The RF transmission line includes a bonding layer, a barrier layer, and diffusion barrier layer, and a conductive layer. The bonding layer has a bonding surface and is configured to receive an RF signal. The barrier layer is configured to prevent a contaminant from entering the bonding layer. The barrier layer is proximate the bonding layer. The diffusion barrier layer is configured to prevent contaminant from entering the bonding layer. The diffusion barrier layer is proximate the barrier layer. The diffusion barrier layer has a thickness that allows the received RF signal to penetrate the diffusion barrier layer to a conductive layer that is proximate to the diffusion barrier layer.

In some implementations, the bonding layer, the barrier layer, and the diffusion barrier layer can be embodied in a finish plating.

The bonding layer can include gold according to certain implementations.

In various implementations, the bonding surface can be configured for wire bonding.

According to a number of implementations, the barrier layer can include palladium.

The diffusion barrier layer can include nickel according to certain implementations. In some implementations, the thickness of the diffusion barrier layer can be in the range from about 0.04 um to about 0.7 um. The thickness of the diffusion barrier layer can be no more than about 0.5 um according to a number of implementations. The thickness of the diffusion barrier layer can be no more than about 0.35 um according to various implementations. The thickness of the diffusion barrier layer can be no more than about 0.75 um according to a certain implementations. In some implementations, the thickness of the diffusion barrier layer can be less than the skin depth of nickel at a frequency of about 0.45 GHz.

In accordance with some implementations, the thickness of the diffusion barrier can be less than the skin depth of the diffusion barrier layer at a frequency of about 0.45 GHz.

According to a number of implementations, the conductive layer can include one or more of copper, aluminum, or silver. For instance, the conductive layer can include copper in certain implementations.

In various implementations, substantially all of the received RF signal can propagate in the conductive layer.

The bonding layer can be gold, the barrier layer can be palladium, and the diffusion barrier layer can be nickel according to certain implementations. In some of these implementations, the thickness of the diffusion barrier layer is can be the range from about 0.04 um to about 0.7 um. According to a number of implementations, the thickness of the diffusion barrier layer can be no more than about 0.5 um. According to certain implementations, the thickness of the diffusion barrier layer can be no more than about 0.35 um. According to some implementations, the thickness of the diffusion barrier layer can be no more than about 0.75 um.

Another aspect of this disclosure is a diffusion barrier layer configured for use in an RF transmission line. The diffusion barrier layer includes a material and has a thickness. The thickness of the diffusion barrier layer is sufficiently small such that an RF signal is allowed to penetrate the diffusion barrier layer.

In certain implementations, the material includes nickel. According to some of these implementations, the thickness of the diffusion barrier layer can be in the range from about 0.04 um to about 0.7 um. According to a number of implementations, the thickness of the diffusion barrier layer can be no more than about 0.5 um. According to some implementations, the thickness of the diffusion barrier layer can be no more than about 0.35 um. According to certain implementations, the thickness of the diffusion barrier layer can be no more than about 0.75 um. In various implementations, the thickness of the diffusion barrier layer can be less than the skin depth of nickel at a frequency of about 0.45 GHz.

In accordance with a number of implementations, the thickness of the diffusion barrier layer can be less than about the skin depth of the material at a frequency of about 0.45 GHz.

According to some implementations, substantially all of the RF signal that penetrates the diffusion barrier layer can travel in a conductive layer proximate the diffusion barrier layer.

In various implementations, the material and/or the thickness of the diffusion barrier layer can prevent contaminants from passing through the diffusion barrier layer.

Another aspect of this disclosure is a mobile device that includes a transmission line, an antenna, and a battery. The transmission line includes a bonding layer, a barrier layer, a diffusion barrier layer, and a conductive layer. The bonding layer has a bonding surface. The barrier layer is proximate the bonding layer. The diffusion barrier is layer proximate to the barrier layer. The conductive layer is proximate to the diffusion barrier layer. The barrier layer and the diffusion barrier layer are configured to prevent conductive material from the conductive layer from entering the bonding layer. The diffusion barrier layer has a thickness that is sufficiently small such that an RF signal is allowed to penetrate the diffusion barrier layer and propagate in the conductive layer. The antenna is coupled to the transmission line and configured to transmit an RF output signal. The transmission line is configured to extend an amount of time for the battery to discharge.

According to certain implementations, the mobile device can include a power amplifier having an output coupled to the transmission line. In some of these implementations, an output of the power amplifier can be coupled to the transmission line via a wire bond. In accordance with various implementations, the transmission line can be configured to transmit the RF signal from the power amplifier to an RF switch. The transmission line can be configured to transmit the RF signal from the power amplifier to a filter according to some implementations.

According to a number of implementations, the mobile device can include a filter having an output coupled to the transmission line. In some implementations, the transmission line can be configured to transmit the RF signal from the filter to an RF switch. In accordance with various implementations, the transmission line can be configured to transmit the RF signal from the filter to the antenna.

According to some implementations, the mobile device can include an RF switch having an output coupled to the transmission line. In certain implementations, the transmission line is configured to transmit the RF signal from the RF switch to the antenna. In accordance with various implementations, the transmission line is configured to transmit the RF signal from the RF switch to a filter.

According to certain implementations, the diffusion barrier layer can include nickel. In some of these implementations, the thickness of the diffusion barrier layer can be in the range from about 0.04 um to about 0.7 um. In a number of implementations, the thickness of the diffusion barrier layer can be no more than about 0.5 um. In some implementations, the thickness of the diffusion barrier layer can be no more than about 0.35 um. In certain implementations, the thickness of the diffusion barrier layer can be no more than about 0.75 um. In various implementations, the thickness of the diffusion barrier layer can be less than the skin depth of nickel at a frequency of about 0.45 GHz.

In a number of implementations, the thickness of the diffusion barrier layer can be less than the skin depth of the material at a frequency of about 0.45 GHz.

In accordance with certain implementations, substantially all of the RF signal can travel in the conductive layer of the transmission line.

According to some implementations, the bonding layer, the barrier layer, and the diffusion barrier layer can be embodied in a finish plating.

Another aspect of this disclosure is a laminate panel including a substrate. The substrate includes a transmission line configured for transmitting an RF signal. The transmission line has a bonding layer, a barrier layer, a diffusion barrier layer, and a conductive layer. The bonding layer has a bonding surface configured for bonding with a conductor separate from the conductive layer. The barrier layer is configured to prevent a contaminant from entering the bonding layer. The diffusion barrier layer includes a material and has a thickness such that contaminants are prevented from passing through the diffusion barrier layer and diffusing between the conductive layer and the bonding layer. The thickness of the diffusion barrier layer is sufficiently small such that the RF signal from the conductor is allowed to penetrate to the conductive layer.

According to certain implementations, the diffusion barrier layer can be nickel. In some of these implementations, the diffusion barrier layer can have a thickness that is less than the skin depth of nickel at a frequency of about 0.45 GHz.

In a number of implementations, the bonding layer can include gold, the barrier layer can include palladium, and the diffusion barrier layer can include nickel. In some of these implementations, the thickness of the diffusion barrier layer can be less than about 0.75 um.

Another aspect of this disclosure is a module that includes a substrate, a first RF component, and a second RF component. The substrate includes a conductor and a transmission line. The transmission line has a bonding layer, a barrier layer, a diffusion barrier layer, and a conductive layer. The bonding layer has a bonding surface configured for bonding with the conductor. The barrier layer and the diffusion barrier layer are configured to prevent a contaminant from entering the bonding layer. The thickness of the diffusion barrier layer is sufficiently small such that an RF signal from the conductor is allowed to penetrate to the conductive layer. The first RF component is coupled to the substrate and configured to generate the RF signal. The second RF component is coupled to the substrate and configured to receive the RF signal from the first component via the transmission line.

In certain implementations, the substrate is a laminate substrate. According to some of these implementations, the substrate can include a finish plating that includes the bonding layer, the barrier layer, and the diffusion barrier layer.

According to a number of implementations, the diffusion barrier layer can include nickel. In a number of implementations, the thickness of the diffusion barrier layer can be no more than about 0.7 um. In some implementations, the thickness can be no more than about 0.35 um. In certain implementations, the thickness of the diffusion barrier layer can be no more than about 0.75 um. In various implementations, the thickness of the diffusion barrier layer can be less than the skin depth of nickel at a frequency of about 0.45 GHz. In accordance with certain implementations, the conductive layer can include copper.

In some implementations, the thickness of the diffusion barrier layer can be less than the skin depth of the material at a frequency of about 0.45 GHz.

In accordance with various implementations, the bonding layer can be configured for wire bonding and the conductor can be electrically coupled to the bonding layer via a wire bond.

According to certain implementations, substantially all of the RF signal can propagate from the first RF component to the second RF component in the conductive layer.

In various implementations, the first RF component can include a power amplifier. According to some of these implementations, the second RF component can include a filter and/or an RF switch.

In some implementations, the first RF component can include an RF switch. According to some of these implementations, the second RF component can include a power amplifier and/or a filter.

In certain implementations, the first RF component can include a filter. According to some of these implementations, the second RF component includes a power amplifier and/or an RF switch.

In accordance with a number of implementations, the barrier layer can be positioned between the bonding layer and the diffusion barrier layer.

Yet another aspect of this disclosure is an RF transmission line that includes a conductive layer and finish plating on the conductive layer. The finish plating includes a gold layer, a palladium layer proximate the gold layer, and a nickel layer proximate the palladium layer. The nickel layer has a thickness that allows an RF signal received at the gold layer to penetrate the nickel layer and propagate in the conductive layer.

In certain implementations, the gold layer can be configured for wire bonding.

In some implementations, the thickness of the nickel layer can be in the range from about 0.04 um to about 0.7 um. According to a number of implementations, the thickness of the nickel layer can be no more than about 0.5 um. According to certain implementations, the thickness of the nickel layer can be no more than about 0.35 um. According to some implementations, the thickness of the nickel layer can be no more than about 0.75 um.

In accordance with certain implementations, the thickness of the nickel layer can be less than the skin depth of nickel at a frequency of about 0.45 GHz.

The conductive layer can include one or more of copper, aluminum, or silver according to some implementations. For instance, the conductive layer can include copper.

According to a number of implementations, substantially all of the RF signal can propagate in the conductive layer.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION

The headings provided herein are for convenience only and do not necessarily affect the scope or meaning of the claimed invention.

Generally described, aspects of the present disclosure relate to a radio frequency (RF) transmission line that includes a diffusion barrier layer. The diffusion barrier layer can include a material and have a thickness such that contaminants are prevented from diffusing and passing through the diffusion barrier layer. The thickness of the diffusion barrier layer can be sufficiently small such that an RF signal penetrates the diffusion barrier layer and propagates in a conductive layer. For example, the thickness of the diffusion barrier layer can be less than the skin depth of the material at a frequency in an RF range (for example, at a frequency selected in the range from about 0.45 GHz to 20 GHz). In some implementations, the diffusion barrier layer can be nickel. According to some of these implementations, the nickel diffusion barrier layer can have a thickness selected from a range of about 0.04 um to 0.5 um. The RF transmission line can also include a bonding layer, a barrier layer for preventing a contaminant from entering the bonding layer, and the conductive layer in which the RF signal propagates.

Particular implementations of the subject matter described in this disclosure can be implemented to realize one or more of the following potential advantages, among others. Using one or more features of the systems, apparatus, and methods described herein, electronic systems, such as systems that include a power amplifier and/or systems configured to transmit and/or receive radio frequency (RF) signals, can operate more efficiently and/or consume less power. Alternatively or additionally, the signal quality of RF signals in such systems can be improved. In some implementations, an amount of gold used to implement a transmission line can be decreased without significantly degrading electrical performance. In fact, according to certain implementations, simulation data and experimental data indicate that the amount of gold used on the transmission line can be decreased and electrical performance can be improved.

A transmission line can be embodied on a packaging substrate or printed circuit board (PCB), which can include a multi-layer laminate. Multi-layer laminate PCBs or package substrates are extensively used in the RF industry. Most RF blocks, such as low noise amplifiers (LNAs), mixers, voltage controlled oscillators (VCOs), filters, switches and whole transceivers may be implemented using semiconductor technologies.

However, in RF modules (for example, an RF front-end module including power amplifiers, switches, filters, the like, or any combination thereof), single chip integration may not be practical due to different blocks being implemented in different semiconductor technologies. For instance, a power amplifier may be formed by a GaAs process, while related control and/or bias circuitry may be formed by a CMOS process. Electromagnetic interaction can degrade electrical performance of blocks, which can cause a system to fail electrical performance specifications. One reason for implementing an RF module in more than one chip is that on-chip passives, such as long transmission lines, inductors, baluns, transformers, the like, or any combination thereof, can have low Q-factor and/or may consume large chip area. Therefore, multi-chip module (MCM) and/or system in package (SiP) assembly technology can be used to achieve low cost, small size and/or high performance in RF module applications.

For cost effectiveness and/or conductor performance considerations, laminate technology can be used for MCM assembly. The laminate technology can include copper for use in a transmission line. Using copper for propagating electrical signals can be desirable due to the physical properties of copper. High Q transmission lines, inductors, transformers, the like, or any combination thereof can be implemented on a laminate substrate. For example, power amplifier modules, output matching networks, harmonic filters, couplers, the like, or any combination thereof can be coupled to a laminate substrate. Conductor loss can have a significant impact on the performance of any of these elements. Accordingly, laminate plating technology can impact RF loss significantly.

Copper traces on outer layers of a laminate can be covered with a solder mask, oxide or other suitable materials in areas where interconnects to external components are not desired. These interconnects can include solder joints for components and/or wire bond connections to die. In areas where solderability and/or wire bondability are preserved, the copper trace can be covered with an organic solderability preservative (OSP) or finish plating. The metallurgy and/or metal layer thicknesses of the finish plating can depend on the function of the exposed area, such as a soldering surface and/or a wire bonding surface. An inert, oxide free surface can maintain solderability and/or wire bondability.

Such metallurgies for finish plating typically include a diffusion barrier to prevent copper diffusion to the plated surface and subsequent oxidation due to exposure to air and/or elevated temperatures during assembly. The diffusion barrier can be, for example, electroplated nickel (Ni) or electroless Ni(P), depending on the chemistry being used. Conventionally, nickel having a thickness of about 2.5 um to about 8 um has been established as a sufficiently thick diffusion barrier layer for the laminate substrate to maintain solderability during thermal excursions encountered during MCM and/or SiP assembly. For gold (Au) wire bonding, electrolytic or electroless Au can be used to form a gold bonding layer with a thickness selected in a range from about 0.4 um to 0.9 um. However, thinner immersion Au layers over Ni have not generally provided reliable Au wire bonding surfaces in high volume assembly operations. Electroless Ni/electroless palladium (Pd)/immersion Au has become available for soldering and wire bonding, including Au wire bonding. This can be a cost effective finish due to a reduction in Au thickness. Electroless Ni/electroless Pd/immersion Au can increase conductor loss in the exposed (finish plated) areas, especially at higher frequencies.

Electrolytic or electroless NiAu or NiPdAu plating technologies are currently used with laminate substrates. Electroless NiPdAu has been successfully implemented despite more lossy electrical characteristics. Some RF modules still use electrolytic or electroless NiAu, which has lower loss, especially at higher frequencies (for example, at frequencies of about 1.9 GHz or greater) for module performance despite the higher costs due to thicker gold.

Transmission Line

Figure 1A:
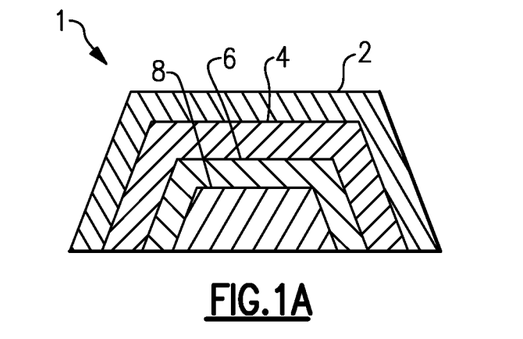
FIG. 1A illustrates a cross section of a transmission line according to some embodiments.

FIG. 1A illustrates a cross section of a transmission line 1 according to some embodiments. The cross section shown in FIG. 1A can represent the cross section of some or all of the transmission line 1. The transmission line 1 can include a bonding layer 2, a barrier layer 4, a diffusion barrier layer 6, and a conductive layer 8. The transmission line 1 can be implemented in an RF circuit and configured for transmitting RF signals. The transmission line 1 can be embodied on a laminate substrate. According to some implementations, the bonding layer 2, the barrier layer 4, and the diffusion barrier layer 6 can be considered finish plating and the conductive layer 8 can be considered a wire. In some implementations, the transmission line 1 can be at least about 5 um, 10 um, 15 um, 20 um, 25 um, 50 um, 75 um, 100 um, 250 um or 500 um long.

In certain implementations, the transmission line 1 can include a gold bonding layer, a palladium barrier layer, a nickel diffusion barrier layer, and a copper conductive layer. For example, in some of these implementations, the transmission line 1 can include a gold bonding layer having a thickness of about 0.1 um, a palladium barrier layer having a thickness of about 0.1 um, a nickel diffusion barrier layer having a thickness selected from a range from about 0.04 um to 0.5 um, and a copper conductive layer having a thickness of about 20 um. The finish plating of the transmission line 1 can be formed by electrolessly plating nickel over the copper conductive layer, electrolessly plating palladium over the nickel, and immersion plating of gold over the palladium. Other suitable processes and/or sub processes of forming the finish plating of such a transmission line can alternatively be implemented. For instance, a nickel diffusion barrier layer can be electroplated over a copper conductive layer.

Although the transmission line 1 includes a gold bonding layer, a palladium barrier layer, a nickel diffusion barrier layer, and a copper conductive layer in certain implementations, it will be understood that other materials can alternatively be used to implement one or more layers of the transmission line 1.

The bonding layer 2 of the transmission line 1 can have a bonding surface configured for soldering and/or wire bonding. The bonding layer 2 can be configured to receive an RF signal at the bonding surface. According to some implementations, a pin of a die can be bonded to the bonding surface of the bonding layer 2. For instance, an output of a power amplifier die can be bonded to the bonding surface of the bonding layer 2 and transmitted to one or more RF components, such as a filter and/or an RF switch, via the transmission line 1. The bonding layer 2 can include gold. In some implementations a thickness of a gold bonding layer can be selected from a range from about 0.05 um to 0.15 um. According to certain implementations, the thickness of a gold bonding layer can be about 0.1 um.

The barrier layer 4 of the transmission line 1 can prevent a contaminant from entering the bonding layer 2. The barrier layer 4 can be proximate the bonding layer 2. In the orientation of FIG. 1A, the bonding layer 2 is disposed over the barrier layer 4. In some implementations, a major surface of the barrier layer 4 can directly contact a major surface of the bonding layer 2, for example, as shown in FIG. 1A. As illustrated in FIG. 1A, the barrier layer 4 can be between the bonding layer 2 and the diffusion barrier layer 6. The barrier layer 4 can include palladium. In some implementations a thickness of a palladium barrier layer can be selected from a range from about 0.03 um to 0.15 um. According to certain implementations, the thickness of a palladium barrier layer can be about 0.1 um.

The diffusion barrier layer 6 of the transmission line 1 can be configured to prevent a contaminant from entering the bonding layer 2 and/or the barrier layer 4. For instance, in some implementations, the diffusion barrier layer 6 can prevent copper from a copper conductive layer from diffusing to a gold bonding layer. The diffusion barrier layer 6 can provide an adhesion surface for the conductive layer 8. According to certain implementations, the adhesion surface of the diffusion barrier layer 6 can adhere to a copper conductive layer.

The diffusion barrier layer 6 can have a thickness sufficiently small such that an RF signal is allowed to propagate in the conductive layer 8. For instance, the thickness of the diffusion barrier layer 6 can be less than the skin depth of the diffusion barrier layer 6 at a frequency in the RF range (for example, at a frequency selected in the range from about 0.9 GHz to 20 GHz). This can allow an RF signal to penetrate the diffusion barrier layer 6. With a diffusion barrier layer 6 of a material and having a thickness that is less than the skin depth of the material at a desired frequency in the RF range, substantially all of the RF signal should travel in the conductive layer 8 of the transmission line 1, assuming that the RF signal also penetrates the bonding layer 2 and the barrier layer 4. For the RF signal to penetrate the bonding layer 2, the thickness of the bonding layer 2 can be less than the skin depth of material forming the bonding layer 2 at the desired frequency in the RF range. Similarly, for the RF signal to penetrate the barrier layer 4, the thickness of the barrier layer 4 can be less than the skin depth of material forming the barrier layer 4 at the desired frequency in the RF range.

The diffusion barrier layer 6 can be between the bonding layer 2 and the conductive layer 8. In the orientation of FIG. 1A, the barrier layer 4 is disposed over the diffusion barrier layer 6 and the diffusion barrier layer 6 is disposed over the conductive layer 8. In some implementations, a major surface of the diffusion barrier layer 6 can directly contact a major surface of the barrier layer 4 and/or the conductive layer 8, for example, as shown in FIG. 1A.

The diffusion barrier layer 6 can include nickel. In some implementations, the diffusion barrier layer 6 can be nickel. The nickel diffusion barrier layer can also prevent copper from the conductive layer from diffusing to a gold bonding layer. A thickness of the nickel barrier layer can be less than the skin depth of nickel at a frequency in the RF range. For instance, the thickness of nickel can be less than the skin depth of nickel at a frequency selected from a range of about 0.45 GHz to 20 GHz. This can allow an RF signal to penetrate through the diffusion barrier layer 6 to the conductive layer 8. According to some implementations, the thickness of a nickel diffusion layer can be less than the skin depth of nickel at about 0.3 GHz, 0.35 GHz, 0.4 GHz, 0.45 GHz, 0.5 GHz, 0.6 GHz, 0.7 GHz, 0.8 GHz, 0.9 GHz, 1 GHz, 2 GHz, 5 GHz, 6 GHz, 10 GHz, 12 GHz, 15 GHz, or 20 GHz. When an alternative material is used in place of nickel for the diffusion barrier layer, the thickness of such a diffusion barrier layer can be less than the skin depth of the alternative material at about 0.3 GHz, 0.35 GHz, 0.4 GHz, 0.45 GHz, 0.5 GHz, 0.6 GHz, 0.7 GHz, 0.8 GHz, 0.9 GHz, 1 GHz, 2 GHz, 5 GHz, 6 GHz, 10 GHz, 12 GHz, 15 GHz, or 20 GHz.

In some implementations, the thickness of a nickel diffusion barrier layer can be less than about 2 um, 1.75 um, 1.5 um, 1.25 um, 1 um, 0.95 um, 0.9 um, 0.85 um, 0.8 um, 0.75 um, 0.7 um, 0.65 um, 0.6 um, 0.55 um, 0.5 um, 0.45 um, 0.4 um, 0.35 um, 0.3 um, 0.25 um, 0.2 um, 0.15 um, 0.1 um, 0.09 um, 0.05 um, or 0.04 um. In certain implementations, the thickness of a nickel diffusion barrier layer can be selected from one of the following ranges: about 0.04 um to 0.7 um, about 0.05 um to 0.7 um, about 0.1 um to 0.7 um, about 0.2 um to 0.7 um, about 0.04 um to 0.5 um, about 0.05 um to 0.5 um, about 0.09 um to 0.5 um, about 0.04 um to 0.16 um, about 0.05 um to 0.15 um, about 0.1 um to 0.75 um, about 0.2 um to 0.5 um, about 0.14 um to 0.23 um, about 0.09 um to 0.21 um, about 0.04 um to 0.2 um, about 0.05 um to 0.5 um, about 0.15 um to 0.5 um; or about 0.1 um to 0.2 um. As one example, the thickness of a nickel diffusion barrier layer can be about 0.1 um. In all of these illustrative implementations, the nickel diffusion barrier layer has a non-zero thickness.

An RF signal can propagate in the conductive layer 8 of the transmission line 1. For instance, the RF signal can penetrate the bonding layer 2, the barrier layer 4, and the diffusion barrier layer 6 to propagate in the conductive layer 8. Substantially all of the RF signal can propagate in the conductive layer 8 of the transmission line 1. The conductive layer 8 can be adhered to the adhesion surface of the diffusion barrier layer 6. The conductive layer 8 can include any suitable material for propagating an RF signal along the transmission line 1. For example, the conductive layer can include copper, aluminum, silver, the like, or any combination thereof. In certain implementations, the conductive layer 8 can be copper. According to certain implementations, the thickness of the conductive layer 8 can be selected from a range from about 10 um to 50 um. In some of these implementations, the thickness of the conductive layer can be selected from a range from about 15 um to 30 um.

Figure 1B:
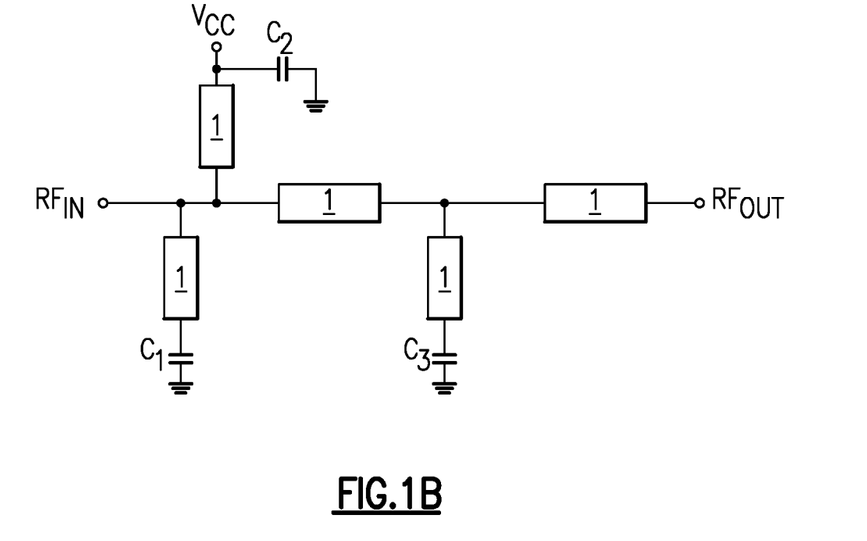
FIG. 1B schematically illustrates example transmission lines of FIG. 1.

FIG. 1B schematically illustrates example transmission lines of FIG. 1A. A transmission line 1 can include more than one transmission line 1 to transmit an RF signal from one node to another node, according to certain implementations. For example, the transmission lines 1 illustrated in FIG. 1B can together implement the transmission line 1 of FIG. 3. The transmission lines 1 in FIG. 1B serve as a medium to transmit an RF signal from a first node $RF_{IN}$ to a second node $RF_{OUT}$. One or more transmission lines 1 can have one end coupled to a power rail, such as power (for example, Vcc) or ground. As illustrated, a transmission line 1 can be coupled to ground via a capacitor $C_1$, $C_2$, or $C_3$.

Skin Depth Calculations

As mentioned earlier, the diffusion barrier layer 6 of the transmission line 1 can include a material and have a thickness that is sufficiently small such that an RF signal is allowed to propagate in a conductive layer. Accordingly, the diffusion barrier layer 6 can have a thickness that is less than a skin depth of the material at a desired frequency. Skin depth can be represented by Equation 1.

$$\delta = \sqrt{\frac{2\rho}{(2\pi f)(\mu_0 \mu_r)}} \quad \text{(Equation 1)}$$

In Equation 1, δ can represent skin depth in meters, $\mu_o$ can represent the permeability of free space (also referred to as vacuum permeability or magnetic constant) having a value of $4\pi \times 10^{-7}$ Henries/meter (about $1.2566370614 \times 10^{-6}$ Henries/meter), $\mu_r$ can represent a relative permeability of the medium, ρ can represent the resistivity of the medium in Ω·m (which can equal to the reciprocal conductivity of the medium), and f can represent frequency of a current propagating through the medium in Hz.

Table 1 below includes plating thicknesses of various layers of three transmission lines. The data in Table 1 correspond to a transmission line with NiAu finish plating and two different transmission lines with NiPdAu finish plating having different nickel layer thicknesses. One of the transmission lines with NiPdAu finish plating has a nickel thickness of 5 um and the other transmission line with NiPdAu finish plating has a nickel thickness of 0.1 um. A nickel thickness of 5 um is within a range of acceptable nickel thicknesses (for example, from 2.5 um to 8 um) that have conventionally been used. In all three of the transmission lines corresponding to the data in Table 1, the conductive layer is copper. The transmission lines with NiPdAu finish plating can have a cross section as shown in FIG. 1A. The transmission line with NiAu finish plating can have a cross section similar to FIG. 1A without the barrier layer 4, in which a gold layer bonding layer is directly over a nickel diffusion barrier layer and the nickel layer is directly over a copper conductive layer.

TABLE 1

| Plating Thickness | | | |
|---|---|---|---|
| | NiPdAu (um) | Thin "Ni" - NiPdAu (um) | NiAu (um) |
| Cu | 21 | 21 | 21 |
| Ni | 5 | 0.1 | 5 |
| Pd | 0.09 | 0.09 | — |
| Au | 0.1 | 0.1 | 0.4 |

Skin depths of these three transmission lines can be computed using Equation 1 and the material properties included in Table 2 below. The relative permeability of nickel can vary depending on a process used to form the nickel layer. For example, phosphorus content in an electroless nickel process can impact the relative permeability of nickel. The range of nickel permeability listed in Table 2 can capture typical ranges of nickel permeabilities.

TABLE 2

| Material Properties | | |
|---|---|---|
| | Resistivity, ρ (μΩ-cm) | $\mu_r$ |
| Cu | 1.673 | 1 |
| Ni | 8.707 | 100-600 |
| Pd | 10.62 | 1 |
| Au | 2.44 | 1 |

The computed skin depths for copper, nickel, palladium, and gold at six different frequencies in the RF range are shown in Table 3 below.

TABLE 3

| Computed Skin Depths | | | | | | |
|---|---|---|---|---|---|---|
| | Skin Depth (um) at 0.45 GHz | Skin Depth (um) at 0.9 GHz | Skin Depth (um) at 1.9 GHz | Skin Depth (um) at 5 GHz | Skin Depth (um) at 12 GHz | Skin Depth (um) at 20 GHz |
| Cu | 3.07 | 2.17 | 1.49 | 0.92 | 0.59 | 0.46 |
| Ni | 0.29-0.7 | 0.2-0.5 | 0.14-0.34 | 0.09-0.2 | 0.06-0.14 | 0.04-0.11 |
| Pd | 7.73 | 5.47 | 3.76 | 2.32 | 1.50 | 1.16 |
| Au | 3.70 | 2.62 | 1.8 | 1.11 | 0.72 | 0.56 |

The data shown in Table 3 indicate that a majority of a signal having a frequency of 0.045 GHz, 0.9 GHz, 1.9 GHz, 5 GHz, 12 GHz, or 20 GHz should travel in nickel in the transmission line with NiAu finish plating. Because the thickness of gold (i.e., 0.4 um) is less than the skin depth for gold (i.e., 3.70 um at 0.45 GHz, 2.62 um at 0.9 GHz, 1.8 um at 1.9 GHz, 1.11 um at 5 GHz, 0.72 um at 12 GHz, and 0.56 um at 20 GHz) and the thickness of nickel (i.e., 5 um) is greater than the skin depth of nickel (i.e., 0.29-0.7 um at 0.45 GHz, 0.2-0.5 um at 0.9 GHz, 0.14-0.34 um at 1.9 GHz, 0.09-0.21 um at 5 GHz, 0.06-0.14 um at 12 GHz, and 0.04-0.11 um at 20 GHz), the signal at 0.45 GHz 0.9 GHz, 1.9 GHz, 5 GHz, 12 GHz, and 20 GHz should travel in both the gold and nickel layers. Since the thickness of nickel is greater than the skin depth in the frequency range from about 0.45 GHz to 20 GHz, signals in this frequency range should not penetrate the nickel layer. Because the skin depth should be less at higher frequencies, signals at frequencies of greater than 20 GHz should also not penetrate the nickel layer. Since the gold is thicker in the transmission line with NiAu finish plating (i.e., 0.4 um) compared to the transmission line with NiPdAu finish plating having a nickel thickness of 5 um (i.e., 0.1 um) relatively more signal conducts in the gold versus nickel in the NiAu transmission line compared to the NiPdAu transmission line with 5 um nickel, making the NiAu transmission line comparatively less lossy.

The data shown in Table 3 also indicate that a majority of a signal having a frequency of 0.45 GHz, 0.9 GHz, 1.9 GHz, 5 GHz, 12 GHz, or 20 GHz should travel in nickel in the transmission line with NiPdAu finish plating with a nickel thickness of 5 um. Because the thickness of gold (i.e., 0.1 um) and the thickness of palladium (0.09 um) are both less that their respective skin depths (i.e., 3.70 um at 0.45 GHz, 2.62 um at 0.9 GHz, 1.8 um at 1.9 GHz, 1.11 um at 5 GHz, 0.72 um at 12 GHz, and 0.56 um at 20 GHz for gold; 7.73 um at 0.45 GHz, 5.47 um at 0.9 GHz, 3.76 um at 1.9 GHz, 2.32 um at 5 GHz, 1.50 um at 12 GHz, and 1.16 um at 20 GHz for palladium) and the thickness of nickel (i.e., 5 um) is greater than the skin depth of nickel (i.e., 0.29-0.7 um at 0.45 GHz, 0.2-0.5 um at 0.9 GHz, 0.14-0.34 um at 1.9 GHz, 0.09-0.21 um at 5 GHz, 0.06-0.14 um at 12 GHz, and 0.04-0.11 um at 20 GHz), the majority of the signal at 0.45 GHz, 0.9 GHz, 1.9 GHz, 5 GHz, 12 GHz, or 20 GHz should travel in nickel. Since the thickness of nickel is greater than the skin depth in at the frequency range from about 0.45 GHz to 20 GHz, signals in this frequency range should not penetrate the nickel layer. Since the skin depth should be less at higher frequencies, signals at frequencies of greater than 20 GHz should also not penetrate the nickel layer. Thus, a majority of an RF signal electrically coupled to the NiPdAu transmission line with a nickel thickness of 5 um via a bonding surface of gold should propagate in nickel.

In contrast, the data shown in Table 3 indicate that a majority of a signal having a frequency of 0.45 GHz, 0.9 GHz, 1.9 GHz, 5 GHz, 12 GHz, or 20 GHz should travel in copper in the transmission line with NiPdAu finish plating having a nickel thickness of 0.1 um. Because the thicknesses of gold, palladium, and nickel are each less than their respective skin depths, the majority of the signal at 0.45 GHz, 0.9 GHz, 1.9 GHz, 5 GHz, 12 GHz, or 20 GHz should penetrate to copper. Since the skin depth is less at higher frequencies, signals at frequencies of greater than 20 GHz should also penetrate to copper. Thus, a majority of an RF signal electrically coupled to the NiPdAu transmission line with a 0.1 um nickel thickness via a bonding surface of gold should propagate in copper.

As shown in Table 2, copper has a resistivity that is about one fifth of the resistivity of nickel. Accordingly, the transmission line with NiPdAu finish plating having a nickel thickness of 0.1 um should have the least resistive loss of the three transmission lines corresponding to the data in Tables 1 and 3 when transmitting signals at a frequency of 0.45 GHz or greater. The data in Table 3 also indicate that a signal with a frequency of 20 GHz can penetrate nickel having a thickness of less than 0.11 um, a signal with a frequency of 12 GHz can penetrate nickel having a thickness of less than 0.14 um, a signal with a frequency of 5 GHz can penetrate nickel having a thickness of less than 0.2 um, a signal with a frequency of 1.9 GHz can penetrate nickel having a thickness of less than 0.34 um, a signal with a frequency of 0.9 GHz can penetrate nickel having a thickness of less than 0.5 um, and a signal with a frequency of 0.45 GHz can penetrate nickel having a thickness of less than 0.7 um. Thus, these signals should propagate in copper in the transmission line with NiPdAu finish plating having a nickel thickness of 0.1 um, provided that the gold and palladium thicknesses are less than the skin depths at the respective frequencies of the signals. Based on Equation 1 and the data in Tables 1 and 2, a signal having a frequency of up to about 22 GHz should be able to penetrate to nickel having a thickness of about 0.1 um.

Wire Bonding

Figure 2A:
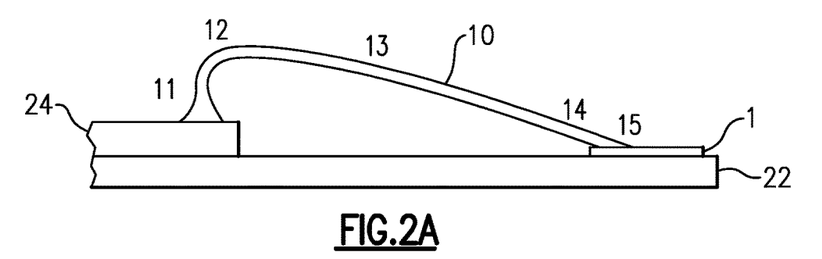
FIG. 2A illustrates an example of a wire bond to the transmission line of FIG. 1.

The transmission line 1 can be electrically coupled to a pin of a die via a wire bond in some implementations. A conductor, such as a wire, can provide an RF signal to the transmission line 1. FIG. 2A illustrates an example of a wire bond to the transmission line 1 of FIG. 1A. As illustrated in FIG. 2A, the transmission line 1 can be included on a substrate 22. A die 24 can also be coupled to the substrate 22. A wire 10 can electrically connect a bonding surface of the bonding layer 2 of the transmission line 1 to the die 24. In this way, the transmission line 1 can receive an RF signal at the bonding surface of the bonding layer 2. The wire 10 can include a ball bond 11, a neck 12, a span 13, a heel 14, a stitch bond 15 (or alternatively a wedge bond), or any combination thereof.

Some wire bond specifications specify that the wire 10 should have a minimum pull strength without experiencing particular failure(s). For instance, in some applications, a wire bond specification specifies that the wire should have a pull strength of at least 3 g after thermal exposure (for example, reflow or bake @ 175 C for 12 hours) and no stitch lift failure modes.

Experimental data were collected for 20 um thick Au and 20 um thick Cu wires. The Au wires were tested in three different transmission lines: a transmission line with NiAu finish plating and two different transmission lines with NiPdAu finish plating having different nickel layer thicknesses (5 um and 0.1 um). The Cu wires were also tested in three different transmission lines: a transmission line with NiAu finish plating and two different transmission lines with NiPdAu finish plating having different nickel layer thicknesses (5 um and 0.1 um). The finish platings correspond to the values shown in Table 1 for NiAu and NiPdAu. Sample conditions of the experiments included standard assembly process before wire bond (surface mount attach and plasma) and extreme thermal exposure to test for Cu diffusion through the Ni diffusion barrier layer affecting wire bondability (surface mount attach and bake and plasma). The experimental data for the standard assembly process indicate that all of Au wires should exceed a 3-4 g pull strength specification after thermal exposure, depending on the wire diameter. The experimental data for the standard assembly process also indicate that most of the Cu wires should exceed the 3-4 g pull strength specification, although process parameters were not optimized. All wire pulls tested under for the extreme thermal exposure met or exceeded the 3 g pull strength specification and no stitch lift failure mode criteria. Accordingly, the experimental data confirms feasibility of wire bondability of NiPdAu finish plating with 0.1 um Ni thickness for MCMs.

Substrates and Arrays

Figure 2B:
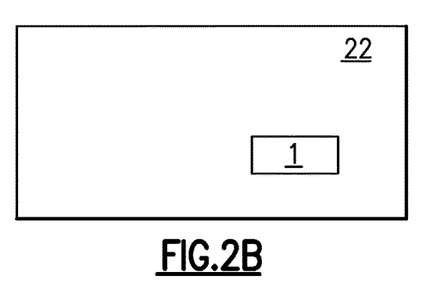
FIG. 2B illustrates an example of a substrate that includes the transmission line of FIG. 1.

FIG. 2B illustrates an example of a substrate 22 that includes the transmission line 1 of FIG. 1. The substrate 22 can include one or more transmission lines 1. The substrate 22 can include any combination of features of the substrates described herein. For example, the substrate 22 can be a laminate substrate including NiPdAu finish plating.

Figure 2C:
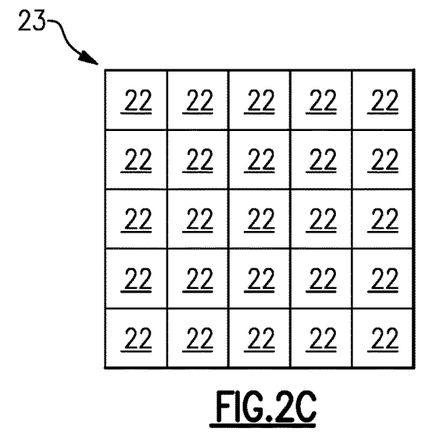
FIG. 2C illustrates an example of an array that includes multiple substrates of FIG. 2B.

Multiple substrates 22 can be manufactured with at the same time with the same processing equipment. FIG. 2C illustrates an example of an array 23 that includes multiple substrates 22 of FIG. 2B. In some implementations, the array 23 can be a laminate panel that includes a substrate 22 having a transmission line 1 configured for transmitting a RF signal. Although the array 23 shown in FIG. 2C includes twenty-five substrates 22, the array 23 can include any suitable number of substrates 22 in other implementations. Transmission lines 1 can be formed on multiple substrates 22, for example, in processes that include any combination of features of the finish plating technology described herein. Then individual substrates 22 can be separated from each other after forming the transmission lines 1, for example, by laser dicing, diamond saws, or any other suitable method.

Plating Technology

NiPdAu plating technology with 0.1 um nickel thickness can reduce costs. This plating technology can also improve RF performance or have minimal RF performance impact. As indicated by the data and calculations discussed earlier, in NiPdAu plating with 0.1 um nickel thickness, an amount of RF signal traveling in gold, palladium, and nickel layers can be reduced and RF energy can be increased and/or maximized in a conductive layer, such as a copper layer, on laminate while maintaining solderability and/or wirebondability. Other experimental data indicate that no finish plating (with all of the signal travelling in the copper layer) provides the lowest insertion loss.

One example of NiPdAu plating technology is electroless NiPdAu. For electroless NiPdAu, the RF signal may not penetrate through the nickel layer if the nickel layer is thicker than skin depth at a frequency of the signal, for example, as indicated by the calculations and data discussed earlier. If nickel thickness is reduced to less than the skin depth of nickel (for example, to about 0.1 um), an RF signal can penetrate through the nickel, palladium, and gold plating layers. Consequently, a major portion of the RF signal energy should be in the copper layer. Copper has significantly lower RF loss as compared with gold, palladium and nickel. The RF in a transmission line with NiPdAu finish plating with 0.1 um thick nickel can be less than RF loss in a comparable transmission with electrolytic NiAu and/or electroless NiAu finish plating. Therefore, the overall electrical performance can be improved by using NiPdAu finish plating with 0.1 um thick nickel. The output match network loss can be reduced from about 0.8 dB to 0.5 dB at 1.9 GHz in some implementations, which can improve the PA power added efficiency by about 3%. This can translate into significant yield improvement and/or enhancement of competitiveness of products that include NiPdAu finish plating with 0.1 um thick nickel.

Experimental data were gathered with two different impedances (6 ohms and 4 ohms) in an output matching network for RF loss characterization. For the 6 ohm output matching network, the experimental data indicate that loss improved by about 0.2 dB. For the 4 ohm output matching network, the experimental data indicate that loss improved by about 0.3 dB. The transmission line that includes electroless NiPdAu finish plating with 0.1 um thick Ni had lower loss than comparable transmission lines with the standard electroless NiPdAu with 5 um thick Ni or electroless NiAu transmission lines.

Modules

Figure 3:
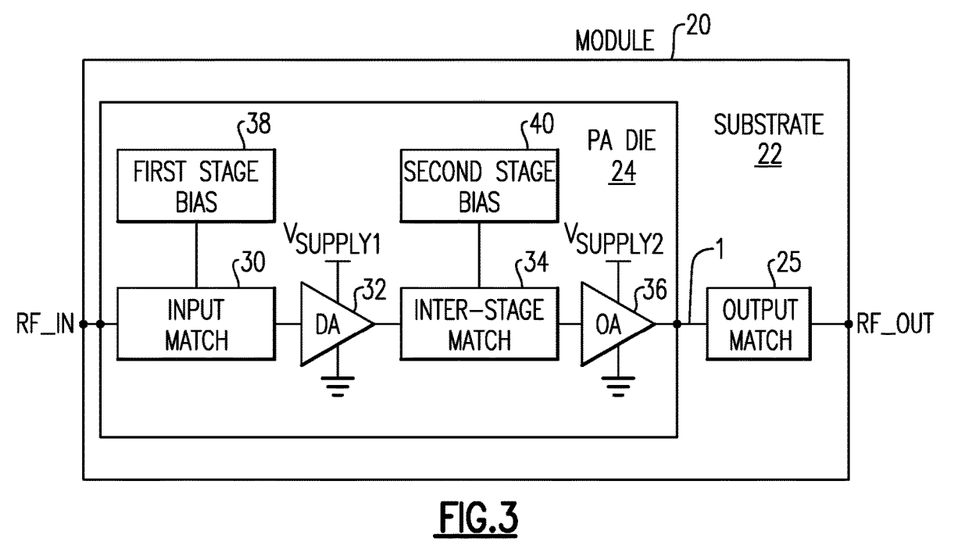
FIG. 3 is a schematic block diagram of an example module that includes the transmission line of FIG. 1.

FIG. 3 is a schematic block diagram of a module 20 that can include the transmission line 1 of FIG. 1A. The module 20 can be referred to as multi-chip module and/or a power amplifier module in some implementations. The module 20 can include a substrate 22 (for example, a packaging substrate), a die 24 (for example, a power amplifier die), a matching network 25, the like, or any combination thereof. Although not illustrated, the module 20 can include one or more other dies and/or one or more circuit elements that coupled to the substrate 22 in some implementations. The one or more other dies can include, for example, a controller die, which can include a power amplifier bias circuit and/or a direct current-to-direct current (DC-DC) converter. Example circuit element(s) mounted on the packaging substrate can include, for example, inductor(s), capacitor(s), impedance matching network(s), the like, or any combination thereof.

The module 20 can include a plurality of dies and/or other components mounted on and/or coupled to the substrate 22 of the module 20. In some implementations, the substrate 22 can be a multi-layer substrate configured to support the dies and/or components and to provide electrical connectivity to external circuitry when the module 20 is mounted on a circuit board, such as a phone board. The substrate 22 can include a laminate with finish plating, for example, including any combination of features of laminates and/or finish platings described herein. The substrate can 22 can provide electrical connectivity between components via a transmission line 1 including any combination of features of the transmission lines described herein. For example, as illustrated, the transmission line 1 can electrically connect the power amplifier die 24 to the output matching network 25.

The power amplifier die 24 can receive a RF signal at an input pin RF_IN of the module 20. The power amplifier die 24 can include one or more power amplifiers, including, for example, multi-stage power amplifiers configured to amplify the RF signal. The power amplifier die 24 can include an input matching network 30, a first stage power amplifier 32 (which can be referred to as a driver amplifier (DA)), an inter-stage matching network 34, a second stage power amplifier 36 (which can be referred to as an output amplifier (OA)), a first stage bias circuit 38 configured to bias the first stage power amplifier 32, a second stage bias circuit 40 configured to bias the second stage power amplifier 36, or any combination thereof. A power amplifier can include the first stage power amplifier 32 and the second stage power amplifier 36. The RF input signal can be provided to the first stage power amplifier 32 via the input matching network 30. The first stage power amplifier 32 can amplify the RF input and provide the amplified RF input to the second stage power amplifier 36 via the inter-stage matching circuit 34. The second stage power amplifier 36 can generate the amplified RF output signal.

The amplified RF output signal can be provided to an output pin RF_OUT of the power amplifier die 24 via an output matching network 25. Any of the transmission lines 1 described herein can be implemented to couple an output of a power amplifier (for example, the amplified RF output signal generated by the second stage power amplifier 36) and/or an output of the power amplifier die 24 to another component. Accordingly, any combination of features of the diffusion barrier layer 6 described herein can also be implemented at an output of a power amplifier and/or an output of the power amplifier die 24. The matching network 25 can be provided on the module 20 to aid in reducing signal reflections and/or other signal distortions. The power amplifier die 24 can be any suitable die. In some implementations, the power amplifier 24 die is a gallium arsenide (GaAs) die. In some of these implementations, the GaAs die has transistors formed using a heterojunction bipolar transistor (HBT) process.

The module 20 can also include one or more power supply pins, which can be electrically connected to, for example, the power amplifier die 24. The one or more power supply pins can provide supply voltages to the power amplifiers, such as $V_{SUPPLY1}$ and $V_{SUPPLY2}$, which can have different voltage levels in some implementations. The module 20 can include circuit element(s), such as inductor(s), which can be formed, for example, by a trace on the multi-chip module. The inductor(s) can operate as a choke inductor, and can be disposed between the supply voltage and the power amplifier die 24. In some implementations, the inductor(s) are surface mounted. Additionally, the circuit element(s) can include capacitor(s) electrically connected in parallel with the inductor(s) and configured to resonate at a frequency near the frequency of a signal received on the pin RF_IN. In some implementations, the capacitor(s) can include a surface mounted capacitor.

The module 20 can be modified to include more or fewer components, including, for example, additional power amplifier dies, capacitors and/or inductors. For instance, the module 20 can include one or more additional matching networks 25. As another example, the module 20 can include an additional power amplifier die, as well as an additional capacitor and inductor configured to operate as a parallel LC circuit disposed between the additional power amplifier die and the power supply pin of the module 20. The module 20 can be configured to have additional pins, such as in implementations in which a separate power supply is provided to an input stage disposed on the power amplifier die 20 and/or implementations in which the module 20 operates over a plurality of bands.

The module 20 can have a low voltage positive bias supply of about 3.2 V to 4.2 V, good linearity, high efficiency (for example, PAE of approximately 40% at 28.25 dBm), large dynamic range, a small and low profile package (for example, 3 mm×3 mm×0.9 mm with a 10-pad configuration), power down control, support low collector voltage operation, digital enable, not require a reference voltage, CMOS compatible control signals, an integrated directional coupler, or any combination thereof.

In some implementations, the module 20 is a power amplifier module that is a fully matched 10-pad surface mount module developed for Wideband Code Division Multiple Access (WCDMA) applications. This small and efficient module can pack full 1920-1980 MHz bandwidth coverage into a single compact package. Because of high efficiencies attained throughout the entire power range, the module 20 can deliver desirable talk-time advantages for mobile phones. The module 20 can meet the stringent spectral linearity requirements of High Speed Downlink Packet Access (HSDPA), High Speed Uplink Packet Access (HSUPA), and Long Term Evolution (LTE) data transmission with high power added efficiency. A directional coupler can be integrated into the module 20 and can thus eliminate the need for an external coupler.

The die 24 can be a power amplifier die embodied in a single Gallium Arsenide (GaAs) Microwave Monolithic Integrated Circuit (MMIC) that includes all active circuitry of the module 20. The MMIC can include on-board bias circuitry, as well as input matching network 30 and interstage matching network 34. An output matching network 25 can have a 50 ohm load that is embodied separate from the die 24 within the package of the module 20 to increase and/or optimize efficiency and power performance.

The module 20 can be manufactured with a GaAs Heterojunction Bipolar Transistor (HBT) BiFET process that provides for all positive voltage DC supply operation while maintaining high efficiency and good linearity. Primary bias to the module 20 can be supplied directly or via an intermediate component from any three-cell Ni—Cd battery, a single-cell Li-Ion battery, or other suitable battery with an output in the range selected from about 3.2 to 4.2 V. No reference voltage is needed in some implementations. Power down can be accomplished by setting an enable voltage to zero volts. No external supply side switch is needed as typical "off" leakage is a few microamperes with full primary voltage supplied from the battery, according to some implementations.

Module Data

FIGS. 4A-4D are graphs illustrating relationships among the transmission line of FIG. 1A and other transmission lines implemented in the module of FIG. 3. A module functionally similar to the module 20 illustrated in and described with reference to FIG. 3 was tested with three transmission lines described with reference to Tables 1-3 above. The NiAu transmission line had a nickel thickness of 5.5 um. The two NiPdAu transmission line finish platings have different nickel thicknesses of 6 um and 0.1 um, respectively. The transmission lines tested include a copper conductive layer with a thickness of about 25 um. Otherwise, the tested transmission lines have the layer thicknesses and other properties described with reference to Tables 1-3 above.

As shown in graphs of FIGS. 4A-4D, the transmission lines with NiPdAu finish plating and a nickel thickness of 0.1 um have the best performance of the three types of transmission lines test, as measured by figure of merit (FOM). In addition, the data included in Table 4 below indicate that yield is comparable for transmission lines with NiPdAu finish plating with a nickel thickness of 0.1 um and transmission lines with NiPdAu finish plating with a nickel thickness of 6 um.

TABLE 4

Yield with Different Finish Plating

| Finish Plating | Yield |
| --- | --- |
| NiAu (5.5 um Ni) | 99.36% |
| NiPdAu (6 um Ni) | 96.86% |
| Ni NiPdAu (0.1 um Ni) | 98.90% |

Power amplifiers can be rated based on a number of metrics, such as adjacent channel power ratio (ACPR), power added efficiency (PAE), figure of merit (FOM), the like, or any combination thereof. ACPR is one metric to assess linearity of a power amplifier. PAE is one metric to assess the power efficiency of a power amplifier. For instance, a lower PAE can reduce the battery life of an electronic device, such as a mobile phone, that includes a power amplifier. FOM is one way to characterize overall quality of a power amplifier.

Figure 4A:
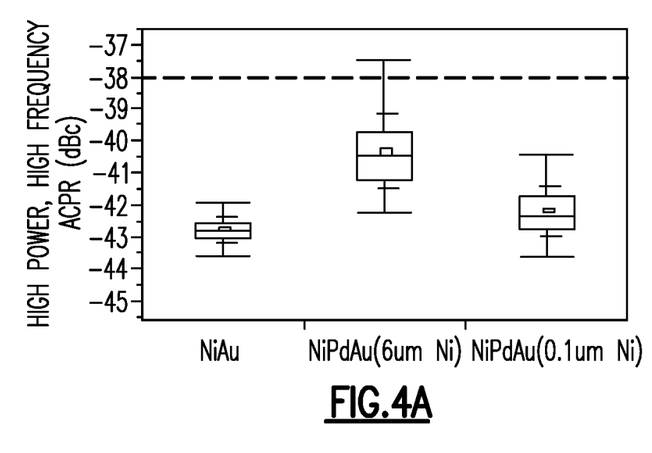
FIGS. 4A-4D are graphs illustrating relationships among the transmission line of FIG. 1 and other transmission lines implemented in the module of FIG. 3.
Figure 4B:
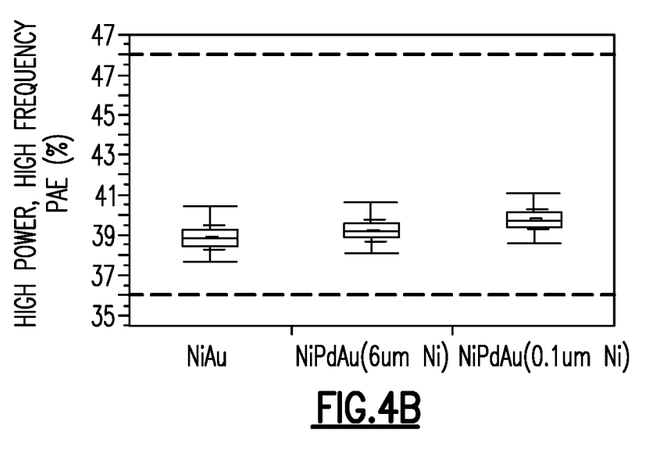

FIGS. 4A and 4B are graphs of ACPR and PAE, respectively, for power amplifiers of the module 20 for high power, high frequency operation corresponding to the three types of transmission lines. Table 5 summarizes some of the data from FIGS. 4A and 4B.

TABLE 5

FOM High Power, High Frequency

| Finish Plating | n = | ACPR Mean | ACPR Std Dev | PAE Mean | PAE Std Dev | FOM (Mean) |
| --- | --- | --- | --- | --- | --- | --- |
| NiAu (5.5 um Ni) | 469 | −42.75 | 0.40 | 38.90 | 0.57 | 81.65 |
| Ni NiPdAu (6 um Ni) | 492 | −40.28 | 1.16 | 39.30 | 0.51 | 79.58 |
| Ni NiPdAu (0.1 um Ni) | 451 | −42.12 | 0.79 | 39.88 | 0.50 | 82.00 |

Figure 4C:
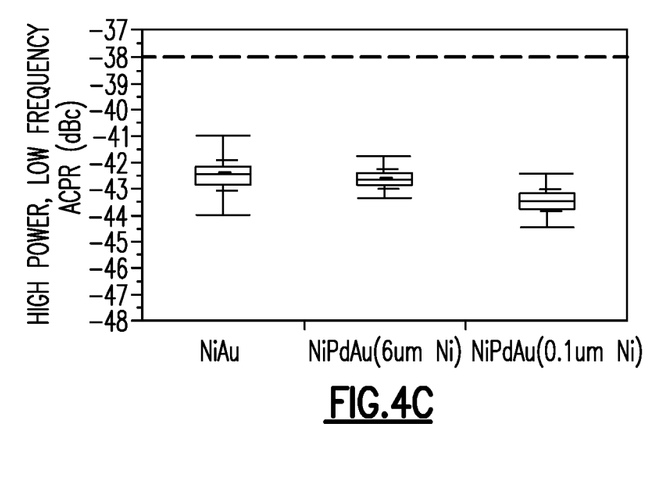
Figure 4D:
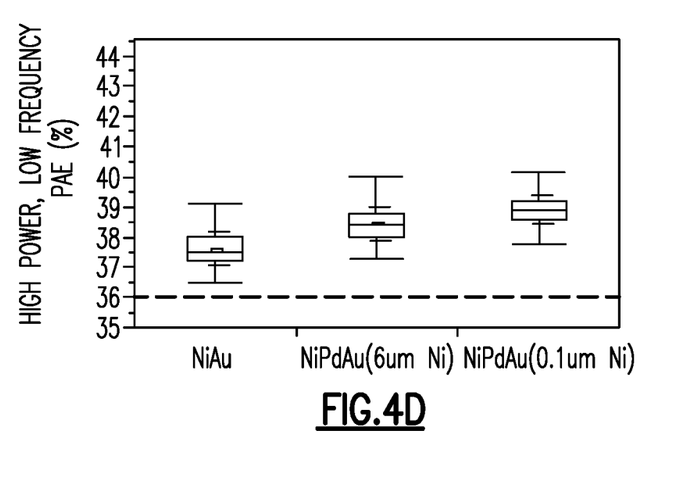

FIGS. 4C and 4D are graphs of ACPR and PAE, respectively, for power amplifiers of the module 20 for high power, low frequency operation corresponding to the three types of transmission lines. Table 6 summarizes some of the data from FIGS. 4C and 4D.

TABLE 6

FOM High Power, Low Frequency

| Finish Plating | n = | ACPR Mean | ACPR Std Dev | PAE Mean | PAE Std Dev | FOM (Mean) |
| --- | --- | --- | --- | --- | --- | --- |
| NiAu (5.5 um Ni) | 469 | −42.48 | 0.57 | 37.63 | 0.56 | 80.11 |
| Ni NiPdAu (6 um Ni) | 492 | −42.56 | 0.32 | 38.48 | 0.55 | 81.04 |
| Ni NiPdAu (0.1 um Ni) | 451 | −43.40 | 0.40 | 38.98 | 0.47 | 82.38 |

The data in Tables 5 and 6 indicate that the transmission lines with NiPdAu finish plating with 0.1 um thick nickel have the best FOM of the tested transmission lines. The data of Table 5 indicate that the mean FOM for the transmission lines with NiPdAu finish plating with 0.1 um thick nickel is 0.35 better than the mean FOM for comparable transmission lines with NiAu plating and 2.42 better than the mean FOM for comparable transmission lines with NiPdAu plating with 6 um nickel thickness. The data in Table 6 indicate that the mean FOM for the transmission lines with NiPdAu finish plating with 0.1 um thick nickel is 2.27 better than the mean FOM for comparable transmission lines with NiAu plating and 1.34 better than the mean FOM for comparable transmission lines with NiPdAu plating with 6 um nickel thickness.

Table 7 summarizes data for high power quiescent collector current $I_{QCC}$ of the module 20 with the three types of transmission lines tested. The data indicate that modules including each type of transmission line have similar DC performance.

TABLE 7

DC Performance

| Finish Plating | n= | Mean IQCC (mA) | Std Dev (mA) |
|---|---|---|---|
| NiAu (5.5 um Ni) | 469 | 95.60 | 5.46 |
| NiPdAu (6 um Ni) | 492 | 94.84 | 5.21 |
| NiPdAu (0.1 um) | 451 | 96.15 | 5.26 |

Table 8 summarizes data for high power, high frequency gains of the power amplifier in the module 20 corresponding to the three types of transmission lines tested. The data in Table 8 indicate that power amplifiers in modules with transmission lines with NiPdAu finish plating with 0.1 um thick nickel have a lowest insertion loss because these power amplifiers have the highest average gains.

TABLE 8

Gain/Insertion Loss

| Finish Plating | n= | Mean Gain | Delta Gain |
|---|---|---|---|
| NiAu (5.5 um Ni) | 469 | 28.65 | — |
| NiPdAu (6 um Ni) | 492 | 28.47 | −0.18 |
| NiPdAu (0.1 um) | 451 | 28.77 | 0.12 |

Example Components Coupled by RF Transmission Lines

Figure 5:
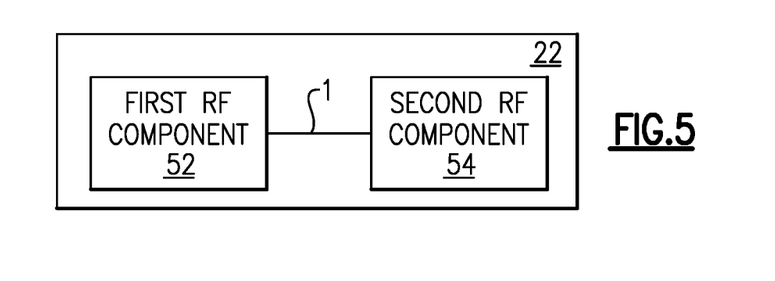
FIG. 5 is a schematic block diagram of two radio frequency (RF) components coupled to each other via the transmission line of FIG. 1.

FIG. 5 is a schematic block diagram of two radio frequency (RF) components coupled to each other via the transmission 1 line of FIG. 1A. FIGS. 6A-6F are schematic block diagrams of various components that can be electrically coupled to each other via the transmission line 1 of FIG. 1A. The illustrated components can be coupled to a substrate 22 that includes any combination of features of the substrates described herein, for example, as described in connection with FIG. 3. As one example, the substrate 22 can have finish plating. Alternatively or additionally, the various components can be included in a mobile device, such as the mobile device 101 described with reference to FIG. 7.

As shown in FIG. 5, the transmission line 1 can electrically couple a first RF component 52 to a second RF components 54. The first RF component 52 can include any suitable circuit element configured to transmit an RF signal, receive an RF signal, process an RF signal, adjust an RF signal, the like, or any combination thereof. Similarly, the second RF component 54 can include any suitable circuit element configured to transmit an RF signal, receive an RF signal, process an RF signal, adjust an RF signal, the like, or any combination thereof. Non-limiting examples of RF components include power amplifiers, RF switches, filters, and antennas.

Figure 6A:
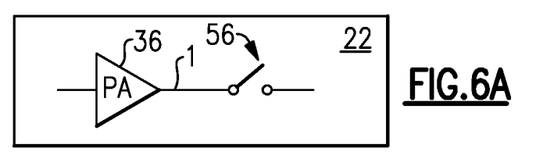
FIGS. 6A-6F are schematic block diagrams of various example RF components that can be electrically coupled to each other via the transmission line of FIG. 1.
Figure 6B:
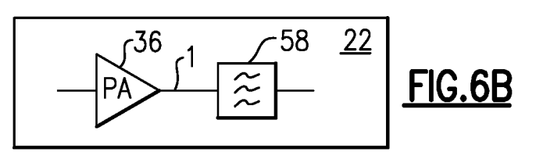

As illustrated in FIGS. 6A and 6B, a power amplifier 105 can have an output electrically coupled to the transmission line 1 included on the substrate 22. For example, the output of the power amplifier 105 can be wire bonded to the transmission line 1. In the implementation shown in FIG. 6A, the transmission line 1 is configured to transmit the output of the power amplifier 105 to an RF switch 56. The RF switch 56 can be any suitable switch configured to pass an RF signal when on and to block the RF signal when off. In the implementation shown in FIG. 6B, the transmission line 1 is configured to transmit the output of the power amplifier 105 to a filter 58. The filter 58 can be any suitable filter configured to filter an RF signal. For instance, the filter 58 can be a low-pass filter, a band-pass filter, or a high-pass filter.

Figure 6C:
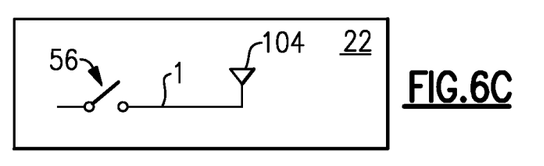
Figure 6D:
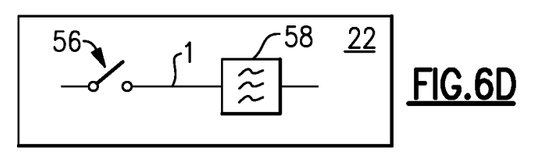

As illustrated in FIGS. 6C and 6D, an RF switch 56 can have an output electrically coupled to the transmission line 1 included on the substrate 22. For example, the output of the RF switch 56 can be wire bonded to the transmission line 1. In the implementation shown in FIG. 6C, the transmission line 1 is configured to transmit the output of the RF switch 56 to an antenna 104. In the implementation shown in FIG. 6D, the transmission line 1 is configured to transmit the output of the RF switch 56 to a filter 58.

Figure 6E:
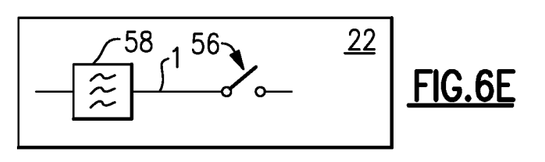
Figure 6F:
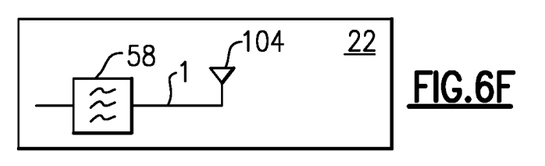

As illustrated in FIGS. 6E and 6F, a filter 58 can have an output electrically coupled to the transmission line 1 included on the substrate 22. For example, the output of the filter 58 can be wire bonded to the transmission line 1. In the implementation shown in FIG. 6E, the transmission line 1 is configured to transmit the output of the filter 58 to an RF switch 56. In the implementation shown in FIG. 6F, the transmission line 1 is configured to transmit the output of the filter 58 to an antenna 104.

Mobile Devices

Figure 7:
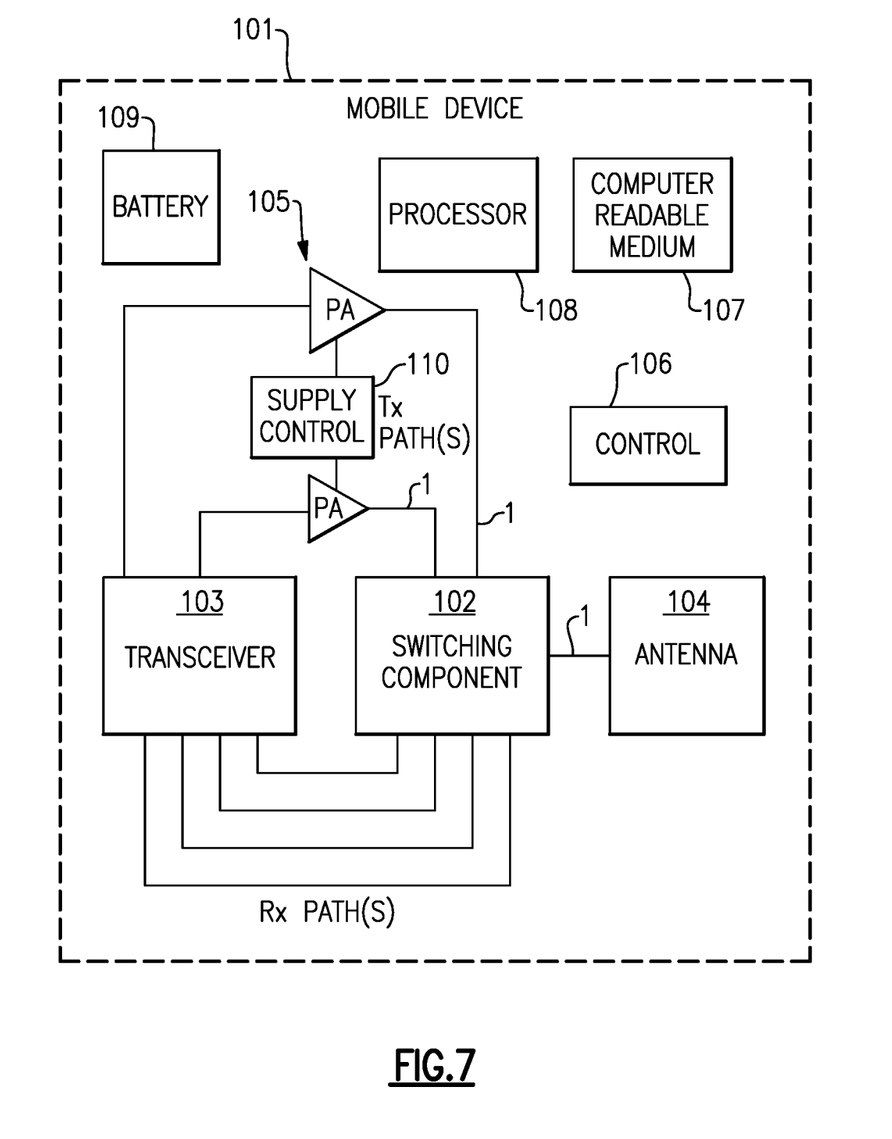
FIG. 7 is a schematic block diagram of an example mobile device that includes the transmission line of FIG. 1.

Any of the systems, methods, and apparatus described herein can be implemented in a variety of electronic devices, such as a mobile device, which can also be referred to as a wireless device. FIG. 7 is a schematic block diagram of an example mobile device 101 that includes the transmission line of FIG. 1A. Examples of the mobile device 101 include, but are not limited to, a cellular phone (for example, a smart phone), a laptop, a tablet computer, a personal digital assistant (PDA), an electronic book reader, and a portable digital media player. For instance, the mobile device 101 can be a multi-band and/or multi-mode device such as a multi-band/multi-mode mobile phone configured to communicate using, for example, Global System for Mobile (GSM), code division multiple access (CDMA), 3G, 4G, and/or long term evolution (LTE).

In certain embodiments, the mobile device 101 can include one or more of a switching component 102, a transceiver component 103, an antenna 104, power amplifiers 105, a control component 106, a computer readable medium 107, a processor 108, a battery 109, and supply control block 110. Any of the transmission lines 1 described herein can be implemented in a variety of locations in the mobile device 1. For instance, as illustrated in FIG. 7, a transmission line 1 can electrically connect an output of a power amplifier 105 to the switching component 102 and/or electrically connect the switching component 102 to the antenna 104.

The transceiver component 103 can generate RF signals for transmission via the antenna 104. Furthermore, the transceiver component 103 can receive incoming RF signals from the antenna 104.

It will be understood that various functionalities associated with the transmission and receiving of RF signals can be achieved by one or more components that are collectively represented in FIG. 7 as the transceiver 103. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 7 as the antenna 104. For example, a single antenna can be configured to provide both transmitting and receiving functionalities. In another example, transmitting and receiving functionalities can be provided by separate antennas. In yet another example, different bands associated with the mobile device 101 can be provided with different antennas.

In FIG. 7, one or more output signals from the transceiver 103 are depicted as being provided to the antenna 104 via one or more transmission paths. In the example shown, different transmission paths can represent output paths associated with different bands and/or different power outputs. For instance, the two example power amplifiers 105 shown can represent amplifications associated with different power output configurations (e.g., low power output and high power output), and/or amplifications associated with different bands.

In FIG. 7, one or more detected signals from the antenna 104 are depicted as being provided to the transceiver 103 via one or more receiving paths. In the example shown, different receiving paths can represent paths associated with different bands. For example, the four example paths shown can represent quad-band capability that some mobile devices 101 are provided with.

To facilitate switching between receive and transmit paths, the switching component 102 can be configured to electrically connect the antenna 104 to a selected transmit or receive path. Thus, the switching component 102 can provide a number of switching functionalities associated with an operation of the mobile device 101. In certain embodiments, the switching component 102 can include a number of switches configured to provide functionalities associated with, for example, switching between different bands, switching between different power modes, switching between transmission and receiving modes, or some combination thereof. The switching component 102 can also be configured to provide additional functionality, including filtering of signals. For example, the switching component 102 can include one or more duplexers.

The mobile device 101 can include one or more power amplifiers 105. RF power amplifiers can be used to boost the power of a RF signal having a relatively low power. Thereafter, the boosted RF signal can be used for a variety of purposes, included driving the antenna of a transmitter. Power amplifiers 105 can be included in electronic devices, such as mobile phones, to amplify a RF signal for transmission. For example, in mobile phones having a an architecture for communicating under the 3G and/or 4G communications standards, a power amplifier can be used to amplify a RF signal. It can be desirable to manage the amplification of the RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot. A power amplifier module can include one or more power amplifiers.

FIG. 7 shows that in certain embodiments, a control component 106 can be provided, and such a component can include circuitry configured to provide various control functionalities associated with operations of the switching component 102, the power amplifiers 105, the supply control 110, and/or other operating component(s).

In certain embodiments, a processor 108 can be configured to facilitate implementation of various functionalities described herein. Computer program instructions associated with the operation of any of the components described herein may be stored in a computer-readable memory 107 that can direct the processor 108, such that the instructions stored in the computer-readable memory produce an article of manufacture including instructions which implement the various operating features of the mobile devices, modules, etc. described herein.

The illustrated mobile device 101 also includes the supply control block 110, which can be used to provide a power supply to one or more power amplifiers 105. For example, the supply control block 110 can include a DC-to-DC converter. However, in certain embodiments the supply control block 110 can include other blocks, such as, for example, an envelope tracker configured to vary the supply voltage provided to the power amplifiers 105 based upon an envelope of the RF signal to be amplified.

The supply control block 110 can be electrically connected to the battery 109, and the supply control block 110 can be configured to vary the voltage provided to the power amplifiers 105 based on an output voltage of a DC-DC converter. The battery 109 can be any suitable battery for use in the mobile device 101, including, for example, a lithium-ion battery. With a transmission line 1 for transmission paths that includes a diffusion barrier layer made of a material, such as nickel, and having a thickness less than the skin depth of the material at a frequency in the RF range, the power consumption of the battery 109 can be reduced and/or signal quality can be improved, thereby improving performance of the mobile device 101.

Applications

Some of the embodiments described above have provided examples in connection with modules and/or electronic devices that include power amplifiers, such as mobile phones. However, the principles and advantages of the embodiments can be used for any other systems or apparatus that have needs for a high performance RF transmission line.

Systems implementing one or more aspects of the present disclosure can be implemented in various electronic devices. Examples of electronic devices can include, but are not limited to, consumer electronic products, parts of the consumer electronic products, electronic test equipment, etc. More specifically, electronic devices configured implement one or more aspects of the present disclosure can include, but are not limited to, an RF transmitting device, any portable device having a power amplifier, a mobile phone (for example, a smart phone), a telephone, a base station, a femtocell, a radar, a device configured to communication according to the WiFi and/or Bluetooth standards, a television, a computer monitor, a computer, a hand-held computer, a tablet computer, a laptop computer, a personal digital assistant (PDA), a microwave, a refrigerator, an automobile, a stereo system, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Part of the consumer electronic products can include a multi-chip module including an RF transmission line, a power amplifier module, an integrated circuit including an RF transmission line, a substrate including an RF transmission line, the like, or any combination thereof. Moreover, other examples of the electronic devices can also include, but are not limited to, memory chips, memory modules, circuits of optical networks or other communication networks, and disk driver circuits. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled," "connected," and the like, as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments is not intended to be exhaustive or to limit the invention to the precise form disclosed above. While specific embodiments of, and examples for, the invention are described above for illustrative purposes, For example, while processes or blocks are presented in a given order, alternative embodiments may perform routines having acts, or employ systems having blocks, in a different order, and some processes or blocks may be deleted, moved, added, subdivided, combined, and/ or modified. Each of these processes or blocks may be implemented in a variety of different ways. Also, while processes or blocks are at times shown as being performed in series, these processes or blocks may instead be performed in parallel, or may be performed at different times.

While certain embodiments of the inventions have been described, these embodiments have been presented by way of example only, and are not intended to limit the scope of the disclosure. For example, various equivalent modifications are possible within the scope of the invention, as those skilled in the relevant art will recognize. Moreover, the elements and acts of the various embodiments described above can be combined to provide further embodiments. Indeed, the methods, systems, apparatus, and articles of manufacture described herein may be embodied in a variety of other forms; furthermore, various omissions, substitutions and changes in the form of the methods, systems, apparatus, and articles of manufacture described herein may be made without departing from the spirit of the disclosure. The accompanying claims and their equivalents are intended to cover such forms or modifications as would fall within the scope and spirit of the disclosure.

What is claimed is:

1. A radio frequency transmission line configured for use in a radio frequency circuit, the radio frequency transmission line comprising:
    a bonding layer having a bonding surface, the bonding surface being bonded to a wire bond that extends from a die to the bonding surface, the die including a radio frequency component configured to provide a radio frequency signal, and the bonding surface being electrically connected to the radio frequency component by way of the wire bond;
    a barrier layer proximate the bonding layer;
    a diffusion barrier layer proximate the barrier layer, the diffusion barrier layer including nickel and having a thickness in a range from 0.04 um to 0.2 um, the diffusion barrier layer and the barrier layer configured to prevent contaminant from entering the bonding layer; and
    a conductive layer proximate to the diffusion barrier layer, the diffusion barrier layer having a thickness that allows the radio frequency signal to penetrate the diffusion barrier layer to the conductive layer.

2. The radio frequency transmission line of claim 1 wherein the thickness of the diffusion barrier layer is less than the skin depth of the diffusion barrier layer at a frequency of about 5 GHz.

3. The radio frequency transmission line of claim 1 wherein the bonding layer includes gold and the barrier layer includes palladium.

4. The radio frequency transmission line of claim 3 wherein the bonding layer has a thickness in a range from 0.05 um to 0.15 um.

5. The radio frequency transmission line of claim 1 wherein the radio frequency signal has a frequency of at least 1.9 GHz.

6. A radio frequency module comprising:
    a radio frequency transmission line including a bonding layer having a bonding surface, the bonding layer configured to receive a radio frequency signal; a barrier layer proximate the bonding layer; a diffusion barrier layer proximate the barrier layer, the diffusion barrier layer and the barrier layer configured to prevent contaminant from entering the bonding layer; and a conductive layer proximate to the diffusion barrier layer, the diffusion barrier layer including nickel and having a thickness of less than 0.3 um that allows the radio frequency signal to penetrate the diffusion barrier layer to the conductive layer;
    a die including a radio frequency component configured to provide the radio frequency signal; and
    a wire bond extending from the die to the bonding surface of the radio frequency transmission line, the bonding surface being electrically connected to the radio frequency component by way of the wire bond.

7. The radio frequency module of claim 6 wherein the bonding layer includes gold and the barrier line includes palladium.

8. The radio frequency module of claim 7 wherein the bonding layer has a thickness in a range from 0.05 um to 0.15 um.

9. The radio frequency module of claim 6 wherein the thickness of the diffusion barrier layer is in a range from 0.04 um and 0.2 um.

10. The radio frequency module of claim 6 wherein the radio frequency component includes a power amplifier.

11. The radio frequency module of claim 10 further comprising a matching network configured to receive the radio frequency signal from the power amplifier via the radio frequency transmission line.

12. The radio frequency module of claim 6 wherein the radio frequency signal has a frequency of at least 1.9 GHz.

13. The radio frequency module of claim 6 wherein the thickness of the diffusion barrier layer is less than the skin depth of the diffusion barrier layer at a frequency of 5 GHz.

14. A mobile device comprising:
a radio frequency transmission line including a bonding layer having a bonding surface, the bonding layer configured to receive a radio frequency signal; a barrier layer proximate the bonding layer; a diffusion barrier layer proximate the barrier layer, the diffusion barrier layer and the barrier layer configured to prevent contaminant from entering the bonding layer; and a conductive layer proximate to the diffusion barrier layer, the diffusion barrier layer including nickel and having a thickness of less than 0.3 um that allows the radio frequency signal to penetrate the diffusion barrier layer to the conductive layer;
a die including a radio frequency component;
a wire bond extending from the die to the bonding surface of the radio frequency transmission line, the bonding surface being electrically connected to the radio frequency component by way of the wire bond; and
an antenna coupled to the radio frequency transmission line, the antenna configured to transmit the radio frequency signal.

15. The mobile device of claim 14 wherein the radio frequency component is a power amplifier.

16. The radio frequency module of claim 15 further comprising a matching network configured to receive the radio frequency signal from the power amplifier via the radio frequency transmission line, the radio matching network being in a signal path between the radio frequency transmission line and the antenna.

17. The mobile device of claim 14 wherein the barrier layer is a palladium layer and the bonding layer is a gold layer.

18. The mobile device of claim 14 wherein the thickness of the diffusion barrier layer is in a range from 0.04 um and 0.2 um.

19. The mobile device of claim 14 wherein the thickness of the diffusion barrier layer is less than the skin depth of the diffusion barrier layer at a frequency of 5 GHz.

20. The mobile device of claim 14 wherein the radio frequency signal has a frequency of at least 1.9 GHz.

* * * * *